(12) United States Patent
Sunata et al.

(10) Patent No.: US 10,936,203 B2
(45) Date of Patent: Mar. 2, 2021

(54) MEMORY STORAGE DEVICE AND SYSTEM EMPLOYING NONVOLATILE READ/WRITE BUFFERS

(71) Applicant: Toshiba Memory Corporation, Minato-ku (JP)

(72) Inventors: Tetsuya Sunata, Yokohama (JP); Daisuke Iwai, Yokohama (JP); Kenichiro Yoshii, Bunkyo (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/126,582

(22) Filed: Sep. 10, 2018

(65) Prior Publication Data

US 2019/0303019 A1 Oct. 3, 2019

(30) Foreign Application Priority Data

Mar. 30, 2018 (JP) .............................. JP2018-069140

(51) Int. Cl.
  *G06F 3/06* (2006.01)
  *G11C 11/56* (2006.01)
  *G06F 12/02* (2006.01)

(52) U.S. Cl.
  CPC .......... *G06F 3/0614* (2013.01); *G06F 3/0679* (2013.01); *G06F 12/0246* (2013.01); *G06F 12/0253* (2013.01); *G11C 11/5628* (2013.01)

(58) Field of Classification Search
  CPC . G06F 3/0679; G06F 12/0246; G06F 12/1009
  See application file for complete search history.

(56) References Cited

U.S. PATENT DOCUMENTS

| 7,978,512 | B2 | 7/2011 | Shiga | |
|---|---|---|---|---|
| 9,507,530 | B2 | 11/2016 | Seo et al. | |
| 9,933,963 | B1* | 4/2018 | Alhussien | G06F 3/0679 |
| 2005/0182892 | A1 | 8/2005 | Nakanishi et al. | |
| 2008/0288716 | A1 | 11/2008 | Arakawa | |
| 2015/0261444 | A1* | 9/2015 | Yoshii | G11C 16/10 |
| | | | | 711/103 |
| 2016/0070508 | A1* | 3/2016 | Ghodsi | G06F 3/0679 |
| | | | | 711/118 |
| 2017/0060425 | A1* | 3/2017 | Sunata | G06F 3/064 |
| 2019/0095321 | A1* | 3/2019 | Lin | G06F 3/0619 |

FOREIGN PATENT DOCUMENTS

| JP | 2010-79774 | 4/2010 |
|---|---|---|
| TW | 200506609 A | 2/2005 |
| TW | 200903493 A | 1/2009 |

* cited by examiner

*Primary Examiner* — Than Nguyen
(74) *Attorney, Agent, or Firm* — Oblon, McClelland, Maier & Neustadt, L.L.P.

(57) ABSTRACT

A memory device can be connected to a host through an interface. The memory device includes a nonvolatile memory which includes a plurality of blocks, and a controller which is electrically connected to the nonvolatile memory. In a case where a read command is received from the host, the controller reads first data designated by the read command from a first block of the nonvolatile memory, to transmit the first data to the host, and to write the first data to a second block of the nonvolatile memory instead of the first block.

20 Claims, 11 Drawing Sheets

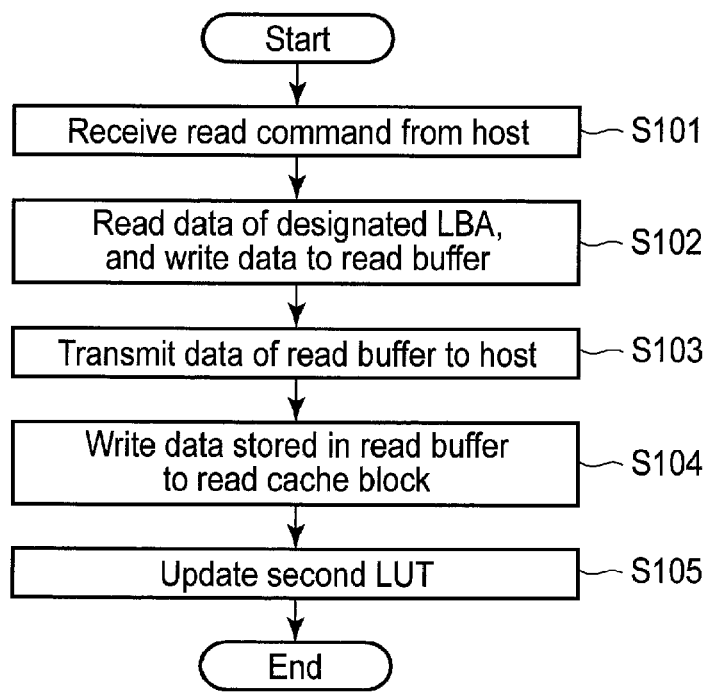
F I G. 2
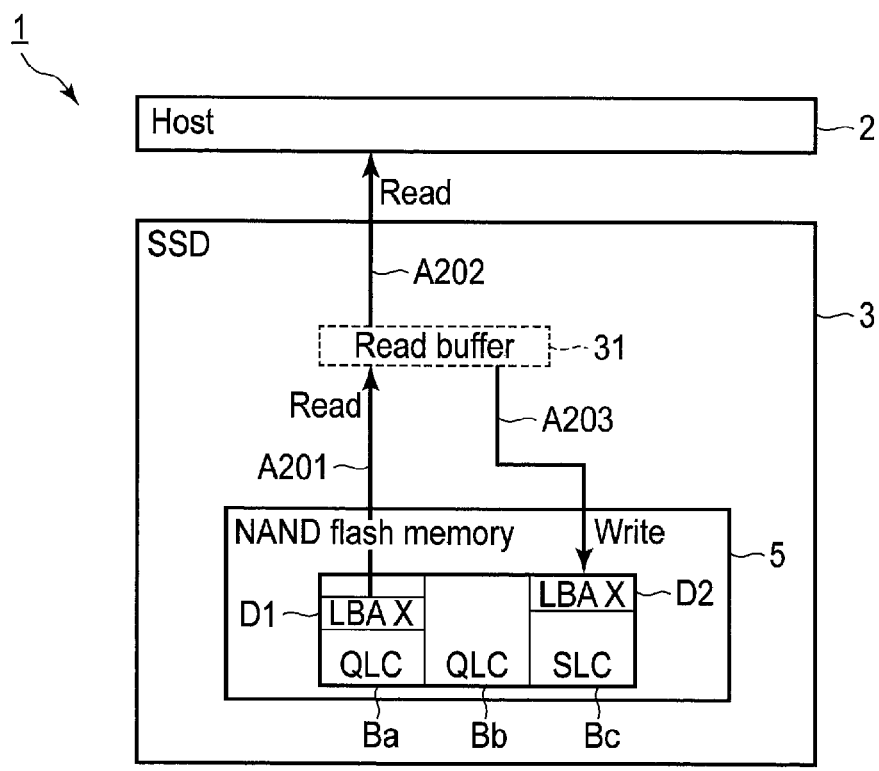
F I G. 3

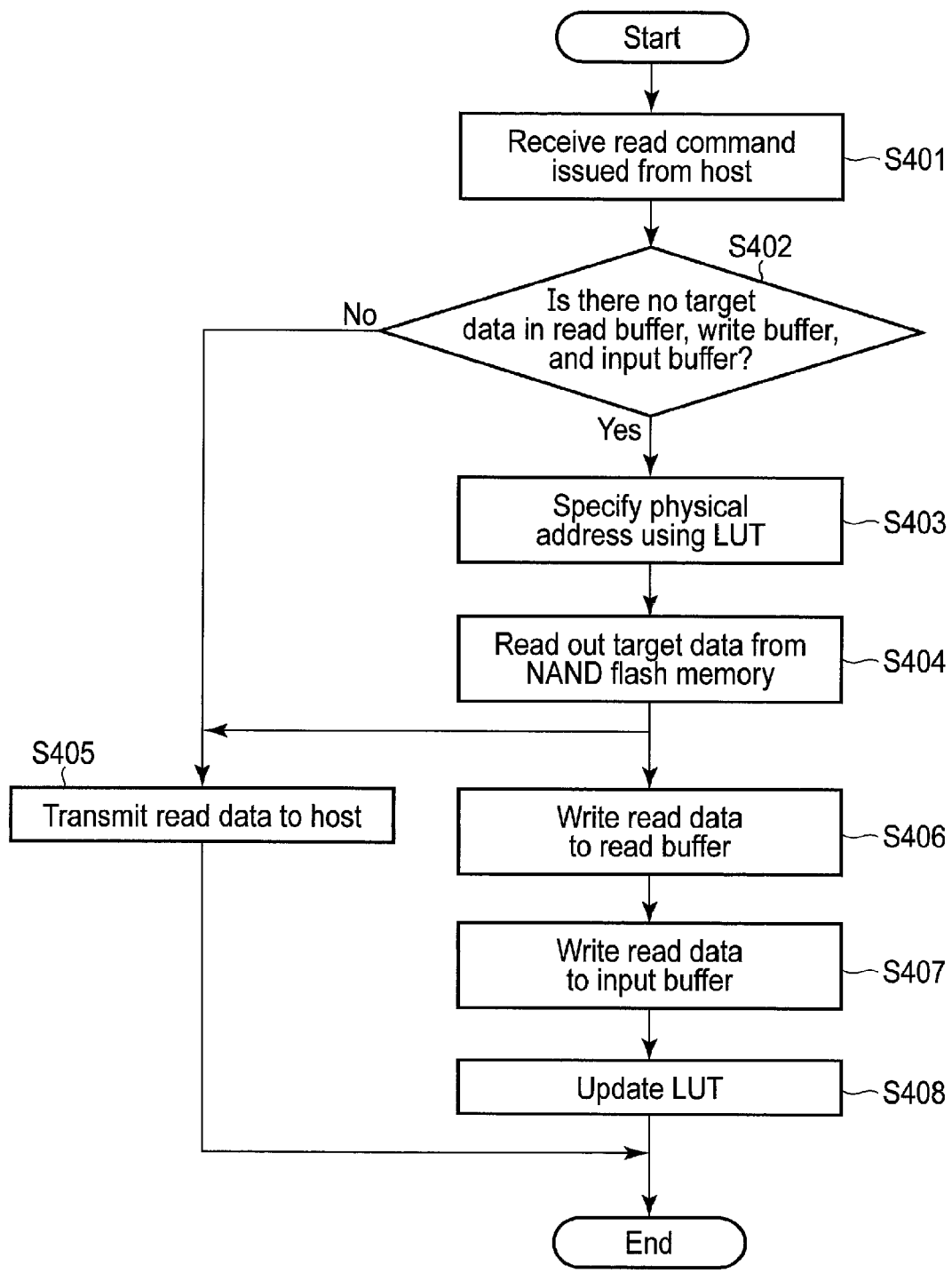
F I G. 8

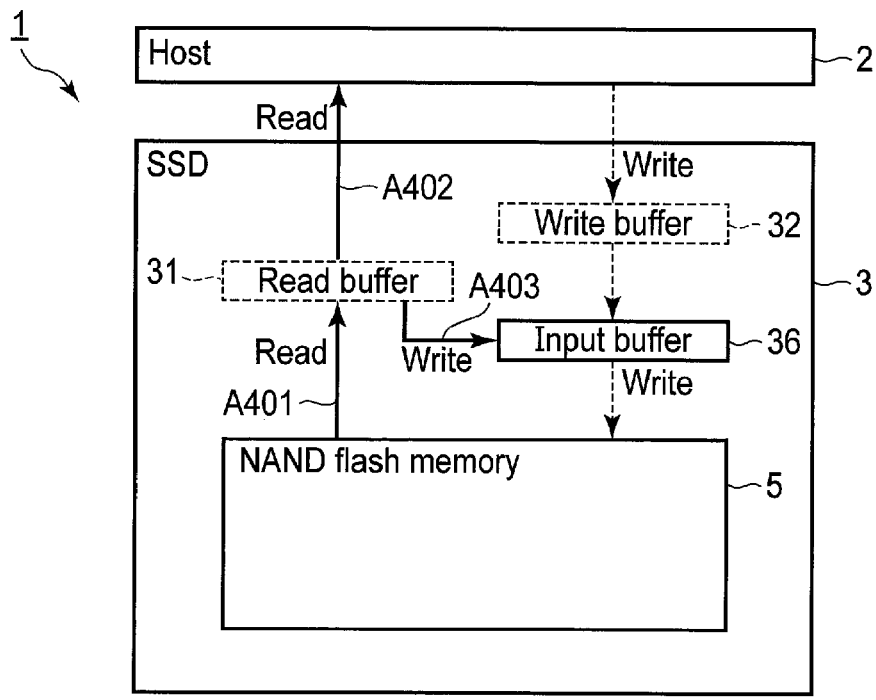
F I G. 9
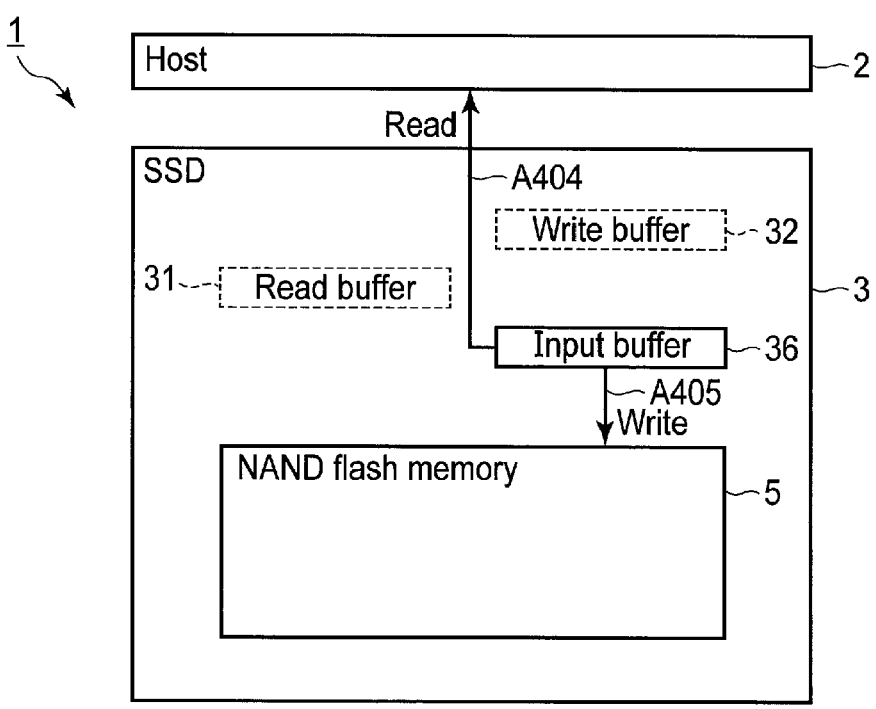
F I G. 10

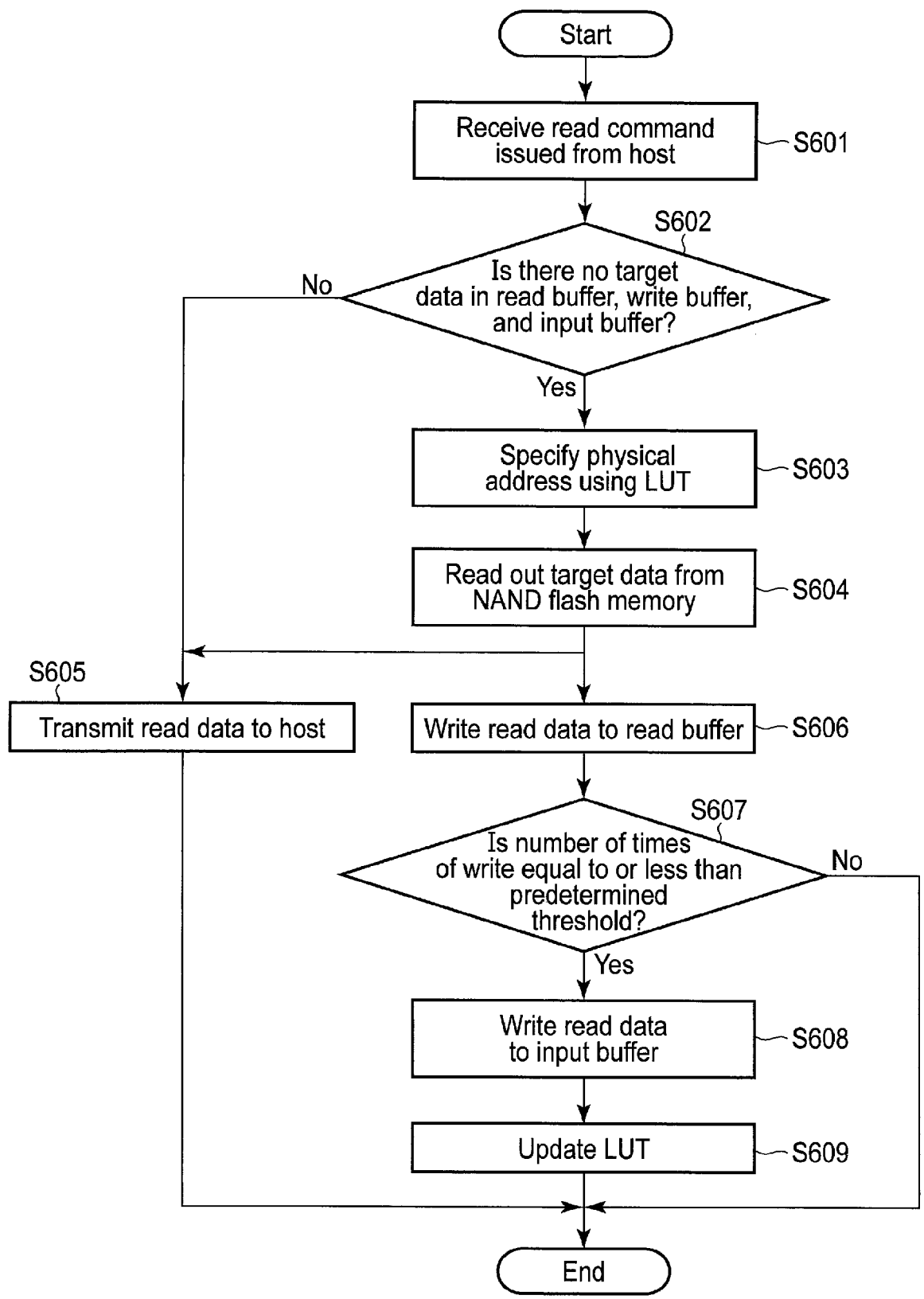
F I G. 12

| Bit | Attribute | Description | | |
|---|---|---|---|---|
| 31:24 | Command Access Size | Number of logical blocks which can be transferred by one read or write command | | |
| 23:11 | Reserved | — | | |
| 10 | Write Prepare | Data set is written in near future | | |
| 09 | Sequential Write Range | Whether data set is target of sequential write | | |
| 08 | Sequential Read Range | Whether data set is target of sequential read | | |
| 07:06 | Reserved | — | | |
| 05:04 | Access Latency | Access delay allowed in data set | | |
| 03:00 | Access Frequency | Access frequency to data set | | |
| | | | Value | Definition |
| | | | 0000b | No information related to access frequency |
| | | | 0001b | Normal (typical) access frequency of write and read |
| | | | 0010b | Write: low frequency, Read: low frequency |
| | | | 0011b | Write: low frequency, Read: high frequency |
| | | | 0100b | Write: high frequency, Read: low frequency |
| | | | 0101b | Write: high frequency, Read: high frequency |
| | | | 0011b-1111b | |

F I G. 14

MEMORY STORAGE DEVICE AND SYSTEM EMPLOYING NONVOLATILE READ/WRITE BUFFERS

CROSS-REFERENCE TO RELATED APPLICATIONS

This application is based upon and claims the benefit of priority from Japanese Patent Application No. 2018-069140, filed Mar. 30, 2018, the entire contents of which are incorporated herein by reference.

FIELD

Embodiments described herein relate generally to a memory device and a computer system which improves read performance and reliability.

BACKGROUND

In recent years, a storage equipped with a nonvolatile memory has been come into wide use. As one of such storages, there is known a solid state drive (SSD) which includes a NAND flash memory. The SSD is used as a main storage of various computing devices.

In a case where a large capacity of memory device is established using the NAND flash memory, there is employed a NAND flash memory which has a high multivalued degree to store plural-bit data in one memory cell. For example, the memory cell which stores 3-bit data in one cell is called a triple-level cell (TLC), and a memory cell which stores 4-bit data in one cell is called a quad-level cell (QLC).

BRIEF DESCRIPTION OF THE DRAWINGS

FIG. 2 is a flowchart illustrating an example of a data flow in an SSD in the computer system according to the first embodiment;

FIG. 3 is a diagram illustrating a first example of the data flow in the SSD in the computer system according to the first embodiment;

FIG. 8 is a flowchart illustrating an example of the data flow in the SSD in the computer system according to the fourth embodiment;

FIG. 9 is a diagram illustrating a first example of the data flow in the SSD in the computer system according to the fourth embodiment;

FIG. 10 is a diagram illustrating a second example of the data flow in the SSD in the computer system according to the fourth embodiment;

FIG. 12 is a flowchart illustrating an example of the data flow in the SSD in the computer system according to a sixth embodiment;

FIG. 14 is a diagram illustrating an example of attribute information of data which is used in the computer system according to the seventh embodiment.

DETAILED DESCRIPTION

Figure 1:
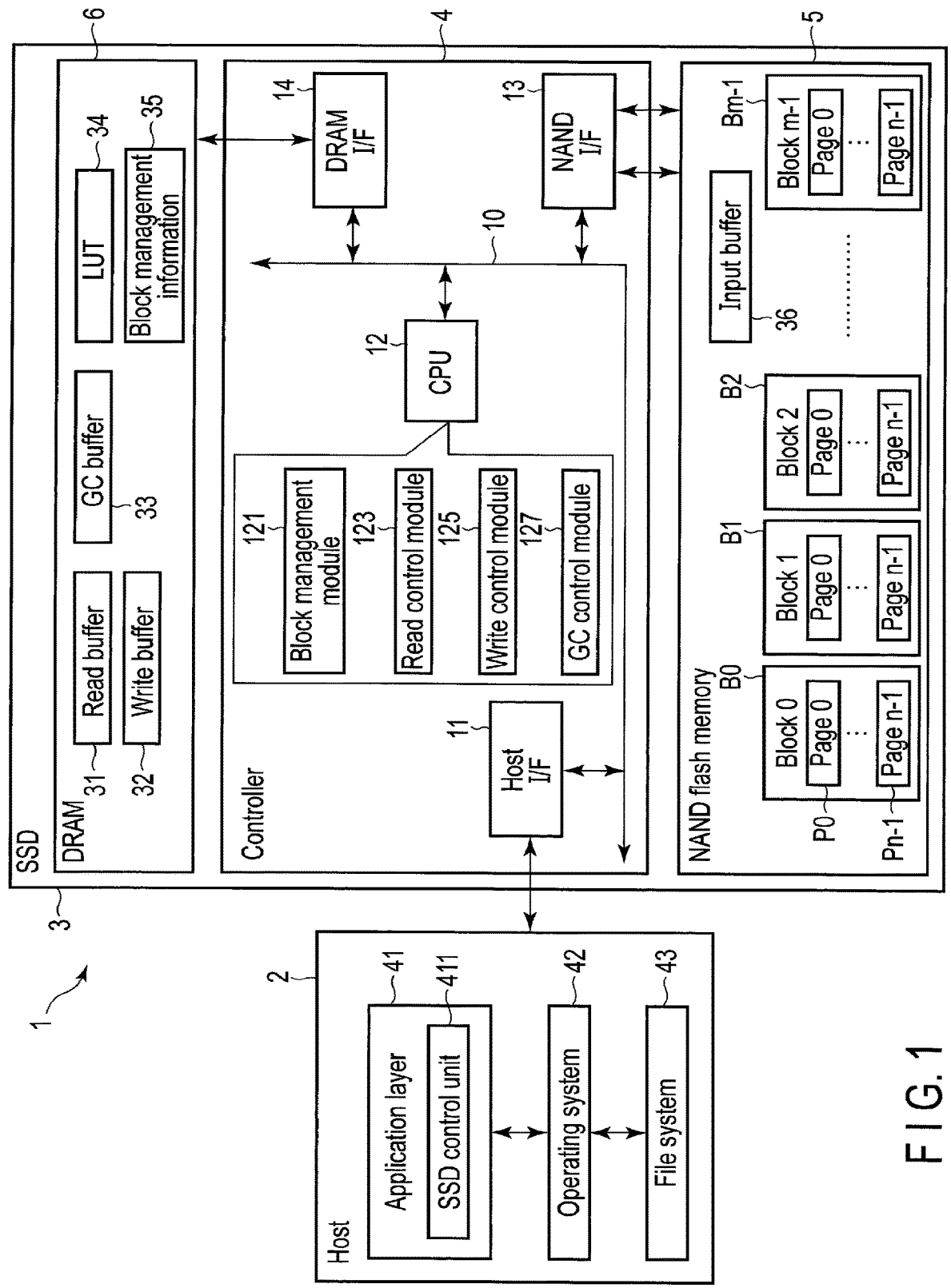
FIG. 1 is a block diagram illustrating an exemplary configuration of a computer system according to a first embodiment.

In general, according to one embodiment, a memory device is configured to be connected to a host through an interface. The memory device includes a nonvolatile memory which includes a plurality of blocks and a controller which is electrically connected to the nonvolatile memory. The controller is configured, in a case where the controller receives the read command from the host, to read first data designated by a read command from a first block of the nonvolatile memory, to transmit the first data to the host, and to write the first data to a second block of the nonvolatile memory instead of the first block.

In this embodiment, a multivalued degree is an index related to the number of bits of data which is stored in one memory cell. For example, the multivalued degree is increased as the number of bits of data stored in one memory cell is increased.

In a NAND flash memory having a high multivalued degree, the number of chips for securing a necessary capacity becomes less as a capacity per chip is increased. Therefore, an access performance to the NAND flash memory is degraded since a parallel access to the plurality of chips is hard (that is, the number of parallel accesses is lowered).

In general, a time taken for read, write, and erase is lengthened as the multivalued degree of the NAND flash memory is increased. In addition, a data retention period is shortened as the multivalued degree is increased, and the reliability is lowered.

A read buffer is mounted in the SSD in order to improve a reading speed of the SSD. The SSD caches data in the read buffer, and thus can read the data at a high speed compared to a case where the data is directly read from the NAND flash memory.

Generally, a volatile memory such as an SRAM and a DRAM is used in the read buffer. The SRAM and the DRAM are expensive, and thus are prepared only by an extremely small capacity with respect to the capacity of the SSD in many cases. Therefore, it is not possible to store a lot of data in the read buffer.

In addition, since the data retention period is shortened as the multivalued degree of the NAND flash memory is increased as described above, a refresh operation is necessary for holding the data at an appropriate timing. In the related art, a configuration that the refresh operation is performed at an efficient timing is not much taken into consideration. For example, a notification by software (or firmware) which is periodically performed, or a retry process at the time of reading data is used as a trigger.

Therefore, paying attention to a reading process in the SSD, the description of the embodiments below will be given about a configuration and a process of the SSD in order to improve the access performance such as the reading speed of data with respect to the SSD, and to perform the refresh operation at an appropriate timing.

More specifically, for example, the SSD reads data from the block having a high multivalued degree with respect to the reading process from the host which is issued to the block having a high multivalued degree, and writes the reading data to another block (or buffer) in the SSD. The block (or buffer) at a write destination of the data is configured by a volatile memory or a nonvolatile memory having a low multivalued degree. Then, the subsequent reading process with respect to the data is performed on the block (or buffer) where the data is stored.

Further, the reading speed of the data at the second and subsequent times is improved as a difference between the multivalued degree of a block of a reading source and the multivalued degree of the write destination block (or buffer) of the reading data is increased.

In addition, the reading target data is written (written back) to another block when being triggered by the read command. In other words, the data having a high access frequency is subjected to the refresh operation at an appropriate timing.

Hereinafter, embodiments will be described with reference to the drawings. In the following explanation, almost or substantially the same functions and components will be attached with the same symbol, and will be described as needed.

First Embodiment

FIG. 1 is a block diagram illustrating an exemplary configuration of a computer system 1 according to this embodiment.

The computer system 1 includes a host (host device) 2 and a semiconductor storage device which is configured to write data to the nonvolatile memory and to read data from the nonvolatile memory.

The host 2 is an information processing device (computing device) which accesses an SSD 3. The host 2 may be a server (storage server) which stores large amount and various types of data in the SSD 3, or may be a personal computer. The semiconductor storage device is realized by the solid state drive (SSD) 3 which includes, for example, the NAND flash memory.

The SSD 3 is a memory device, and may be used as a main storage of the information processing device which serves as the host 2. The SSD 3 may be built in the information processing device, or may be connected to the information processing device through a cable or a network. The SSD 3 is connected to the host 2 as a direct attached storage (DAS) for example.

Examples of the interface for interconnection between the host 2 and the SSD 3 include SCSI, Serial Attached SCSI (SAS), ATA, Serial ATA (SATA), PCI Express (PCIe) (registered trademark), Ethernet (registered trademark), Fibre channel, and NVM Express (NVMe) (registered trademark).

The SSD 3 includes a controller 4 and a nonvolatile memory (NAND flash memory) 5. The controller 4 may be realized by a circuit such as a System-on-a-chip (SoC). The SSD 3 may include a random access memory (volatile memory), for example, a DRAM 6. Alternatively, a random access memory such as an SRAM may be built in the controller 4.

In a random access memory such as the DRAM 6, for example, there are provided with a read buffer 31 which is a buffer region to temporarily store the data read from the NAND flash memory 5, a write buffer 32 and a GC buffer 33 which are buffer regions to temporarily store the data written to the NAND flash memory 5, and a cache region of a lookup table (LUT) 34 which serves as an address conversion table (logical-physical address conversion table).

Further, a random access memory such as the DRAM 6 may be provided with a storage region of various types of information (for example, block management information 35) which is used in process. Further, the DRAM 6 may be provided in the controller 4. The LUT 34 is used to manage mapping between logical addresses and physical addresses of the NAND flash memory 5.

The NAND flash memory 5 may include a plurality of NAND flash memory chips (a plurality of NAND flash memory dies).

Each chip includes a memory cell array. The memory cell array includes a plurality of NAND blocks (blocks) B0 to Bm-1. The blocks B0 to Bm-1 serve as units of erase. The block may be called "physical block" or "erase block".

The blocks B0 to Bm-1 include a plurality of pages (physical pages). In other words, each of the blocks B0 to Bm-1 includes pages P0 to Pn-1. In the nonvolatile memory, reading and writing of data is performed in units of pages. Erasing of data is performed in units of blocks.

In addition, each chip is configured using a single cell (SLC) to store 1-bit data per memory cell and/or a memory cell to store a plurality of bits. Examples of the memory cell to store a plurality of bits include a multiple cell (MLC), a triple cell (TLC), and a quad cell (QLC).

In addition, the NAND flash memory 5 includes, for example, an input buffer 36. The input buffer 36 is used as a storage destination of data (write data) which is a target to write in a case where the SSD 3 receives a write command from the host 2 for example. Further, the input buffer may be provided in the outer side of the NAND flash memory 5.

The input buffer 36 has a storage capacity of about several percent of a total capacity of the NAND flash memory 5 for example. In addition, the read buffer 31 and the write buffer 32 have a storage capacity of $\frac{1}{100}$ times the input buffer 36 for example.

It is desirable for input buffer 36 to be configured by the NAND flash memory having a low multivalued degree. In the following, the input buffer 36 is assumed as being configured by the SLC for example.

In addition, not only the NAND flash memory 5 but also a volatile memory such as an SRAM and a DRAM may be used in the input buffer 36.

The controller 4 is electrically connected to the NAND flash memory 5 (nonvolatile memory) through a NAND interface 13 such as Toggle DDR and Open NAND Flash Interface (ONFI). The NAND interface 13 serves as a NAND control circuit which is configured to control the NAND flash memory 5. The NAND interface 13 may be connected to each of a plurality of chips in the NAND flash memory 5 through a plurality of channels.

The controller 4 serves as a memory controller which is configured to control the NAND flash memory 5.

The controller 4 may serve as a flash translation layer (FTL) which is configured to perform data management and block management of the NAND flash memory 5. In the data management performed by the FTL, there are included (1) management of mapping information which indicates a correspondence relation between each logical address and the physical address of the NAND flash memory 5, and (2) hiding processing of reading/writing in units of pages and erasing in units of blocks. The logical address is an address to be used by the host 2 to designate an address of the SSD 3. For example, a logical block address (LBA) is used as the logical address.

The management of mapping between each logical block address (LBA) and each physical address is performed using the LUT 34 which serves as the address conversion table (logical-physical address conversion table). The controller 4 manages the mapping between each the LBA and each physical address in units of predetermined management sizes using the lookup table LUT 34. A physical address corresponding to a certain LBA indicates a physical memory position in the NAND flash memory 5 where the data of the LBA is written. The address conversion table LUT 34 may be loaded from the NAND flash memory 5 to the DRAM 6 when the SSD 3 is powered on.

In a data writing of one page, only one time per erase cycle (program/erase cycle) is possible. Therefore, the controller 4 writes update data corresponding to a certain LBA to another physical memory position instead of the physical memory position where the earlier data corresponding to the LBA is stored. Then, the controller 4 updates the LUT 34 to associate the LBA to the other physical memory position, and invalidates the earlier data. In the following, data (that is, data linked to the logical address) referred from the LUT 34 is called valid data. In addition, data linked to no logical address is called invalid data. The valid data is data which has a possibility to be read from the host 2 later. The invalid data is data which has no possibility to be read from the host 2 no longer.

Management of bad blocks, wear leveling, garbage collection (GC), and the like are included in the block management.

In the NAND flash memory 5, the writing/reading of data is performed in units of pages, and the erasing is performed in units of blocks. Erasing a block needs to a long time, and each block in the NAND flash memory 5 has a property that data is not rewritten at the same physical memory position during the erasing is performed.

Therefore, the SSD 3 operates in a manner that writing data received from the host 2 is additionally written at a new physical memory position on the NAND flash memory 5. In a case where such an additional writing is progressed, a writing destination block of data will run out. Therefore, the GC is performed to generate a free block.

In the GC, a GC source block is selected from already-written blocks (active block), and the valid data is collected from the GC source block and written to a new block (GC destination block). Then, the block where the valid data is originally stored is set as a free block. The free block can be used as a new writing destination block by an erase process. In many cases, a block having a less number of pieces of valid data is selected as the GC source block. The reason is that an efficiency of generating a free block is good.

The controller 4 may include a host interface 11, a CPU 12, the NAND interface 13, and a DRAM interface 14. The host interface 11, the CPU 12, the NAND interface 13, and the DRAM interface 14 may be connected to each other through a bus 10.

The host interface 11 serves as a circuit to receive various commands from the host 2 such as an I/O command and various types of control commands. The I/O command may include a write command, a read command, an unmap command (trim command), a format command, and a flash command. Further, the write command is also called a program command. The format command is a command to map the entire memory system (the SSD 3). The flash command is a command to write dirty data (user data and relevant management data) cached (buffered) in the memory system to the NAND flash memory 5 to make a complete clean state.

The DRAM interface 14 serves as a DRAM controller which is configured to control the access of the DRAM 6. A memory region of the DRAM 6 is used to store the read buffer 31, the write buffer 32, the GC buffer 33, the LUT 34, the block management information 35, and the input buffer 36.

The CPU 12 is a processor which is configured to control the host interface 11, the NAND interface 13, and the DRAM interface 14. The CPU 12 performs various processing by executing a control program (firmware) which is stored in a ROM (not illustrated). The CPU 12 can perform a command processing in order to process various commands from the host 2 in addition to the above FTL processing. The operation of the CPU 12 is controlled by the above firmware which is executed by the CPU 12. Further, part or all of the FTL processing and the command processing may be performed by a dedicated hardware in the controller 4.

In this embodiment, the CPU 12 may serve as, for example, a block management module 121, a read control module 123, a write control module 125, and a GC control module 127.

The block management module 121 manages the block management information 35 which includes the number of times of erase (the number of program/erase cycles), an erase sequence number, and the number of pieces of valid data (valid data volume) for each block in the SSD 3. The block management module 121 updates the block management information 35, for example, whenever a write operation on each block, a trim (unmap) operation, and an erase operation are performed.

The read control module 123 can obtain the physical address corresponding to the LBA, and read the data corresponding to the read command from the NAND flash memory 5 based on an entry of the LUT 34 corresponding to the logical address (LBA).

The write control module 125 accumulates the user data received from the host 2 in the write buffer 32 on the DRAM 6 according to the write command. The write control module 125 previously secures a region of the write buffer 32 to accumulate the user data. When the region is not possible to be secured, the write control module 125 is configured not to receive the write command from the host 2.

Then, if the user data is accumulated in the write buffer 32 in a unit of writing of the NAND flash memory 5, the write control module 125 transfers the user data in a unit of writing to a chip (a data latch of the chip) of the NAND flash memory 5. The write control module 125 releases the region where the transferred user data is accumulated in the write buffer 32.

Next, the write control module 125 designates the chip of the NAND flash memory 5 to be programmed. In other words, the write control module 125 sends the program command to the chip of the NAND flash memory 5 to program the writing destination block with the transferred user data with respect to the chip. A memory cell array 50 in the chip includes a plurality of blocks. The block is roughly classified into a block (active block) in which the valid data is stored and no new data is not possible to be written, and a block (free block) in which the valid data is not stored and new data is possible to be written through the erase process. One block is selected from one or more free blocks, and assigned as a writing destination block through the erase process. The writing destination block can store the valid data.

The GC control module 127 also can perform writing onto the NAND flash memory 5 using the GC buffer 33 similarly to the write operation of the write control module 125 as described above. The GC control module 127 selects a garbage collection source block (GC source block) from an active block group which stores the valid data, and writes the valid data in the GC source block to a garbage collection destination block (GC destination block) which is secured as a writing destination block from a free block group.

Next, a configuration of the host 2 will be described. The host 2 has a function to make an access to the SSD 3 which is connected as the DAS. In addition, the host 2 may have a function to make an access to a storage on a network (cloud).

The host 2 is an information processing device which executes various programs. In the program executed by the information processing device, there are included an application layer 41, an operating system (OS) 42, and a file system 43.

As it is known generally, the operating system (OS) 42 is software configured to manage the entire host 2, control hardware in the host 2, and perform control to enable an application to use hardware and the SSD 3.

The file system 43 is used to control the operations (creating, storing, updating, and erasing) of a file. For example, ZFS, Btrfs, XFS, ext4, and NTFS may be employed as the file system 43. Alternatively, a file object system (for example, Ceph Object Storage Daemon) and a key value store system (for example, Rocks DB) may be used as the file system 43.

Various application software threads are executed on the application layer 41. As an example of the application software thread, there are client software, database software, and a virtual machine.

When the application layer 41 is needed to send a request such as the read command or the write command to the SSD 3, the application layer 41 sends the request to the OS 42. The OS 42 sends the request to the file system 43. The file system 43 translates the request to a command (a read command and a write command). The file system 43 sends the command to the SSD 3. When receiving a response from the SSD 3, the file system 43 sends the response to the OS 42. The OS 42 sends the response to the application layer 41.

The application layer 41 includes an SSD control unit 411. The SSD control unit 411 has an interface function of communicating with the SSD 3 for various types of control of the SSD 3. The SSD control unit 411 transmits various types of control commands and data to the SSD 3.

In this embodiment, in a case where the host 2 issues a read command to the SSD 3, reading target data (hereinafter, referred to as read data) is written to another block in the NAND flash memory 5. Hereinafter, using FIGS. 2 and 3, a data flow in the SSD 3 in the computer system 1 according to this embodiment will be described.

Further, FIG. 3 conceptually illustrates a data flow between the host 2 and the SSD 3. For example, some components in the controller 4 and in the SSD 3 such as the DRAM 6 will be omitted. In addition, Arrows A201 to A203 of FIG. 3 illustrate the data flow.

In Step S101, the controller 4 of the SSD 3 receives the read command from the host 2. With the read command, a start (head) LBA of the read target data and a data length are designated. An LBA range (logical address range) of the read target data is determined by the start (head) LEA and the data length. In Step S102, the controller 4 reads Data D1 of which the LBA designated by the read command is (X) for example by the NAND flash memory 5, and written to the read buffer 31 (Arrow A201). Further, the data D1 is assumed as stored in a block Ba.

In Step S103, the controller 4 transmits Data D1 stored in the read buffer 31 to the host (Arrow A202).

In Step S104, the controller 4 writes back, for example, Data D1 to a block Bc which is "another block" in the NAND flash memory 5. Further, any one of the processes of Steps S103 and S104 may be performed earlier.

The other block is also called a read cache block. In this embodiment, the data of the same LBA (X) exists in two places on the block Ba of a reading source and the block Bc (read cache block) of a writing source.

Herein, in this embodiment, the multivalued degree of the block Ba from which Data D1 is read in Step S102, and the multivalued degree of the block Bc (read cache block) to which Data D1 is written in Step S104 are different. More specifically, the multivalued degree of the block Ba is larger than the multivalued degree of the block Sc (read cache block). In the example of FIG. 3, Data D1 to be read by the read command is read from the block Ba of the QLC, and written to the block Bc of the SLC.

Further, in the following, the multivalued degree of the block which is stored with Data D1 (the target of the read command) is assumed as the QLC. For example, other multivalued degrees of TLC and MLC may be used.

In Step S105, the controller 4 updates a second LUT for managing a correlation between the LBA of Data D1 and the physical address in the read cache block. Further, the LUT 34 of the DRAM 6 is an LUT for managing the correlation between the LBA of Data D1 and the physical address in the block Ba where Data D1 is stored. Therefore, Data D1 stored in the block Bc (read cache block) is necessarily managed by the second LUT which is different from the LUT 34.

In addition, Data D1 read by the host 2 is data having a high access frequency due to locality in reference, and has a high possibility to be often read by the host 2.

Figure 4:
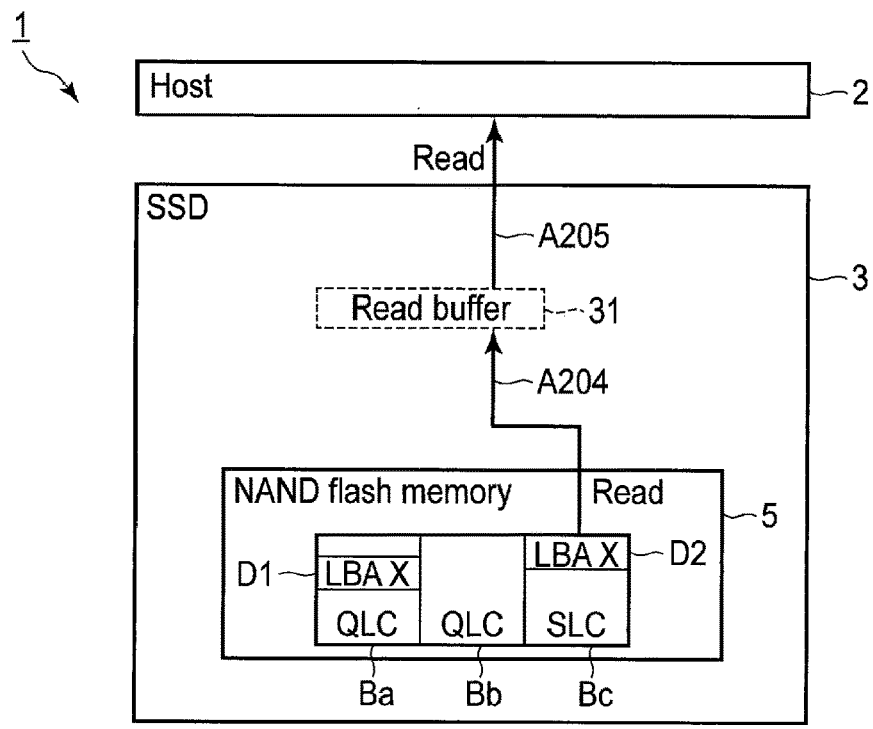
FIG. 4 is a diagram illustrating a second example of the data flow in the SSD in the computer system according to the first embodiment.

Hereinafter, the description will be given using FIG. 4 about the data flow when Data D1 is read from the host 2 again after Data D1 is written to the block Bc as described above.

In a case where the controller receives a read command to read Data D1 from the host 2, the controller 4 retrieves the second LUT before retrieving the LUT 34, and reads Data D1 from the read cache block (the block Bc) (Arrows A204 and A205). With this configuration, Data D1 is read at a high speed compared to the case of reading from the block Ba. In addition, a block having a low multivalued degree has a long data retention period compared to the block having a high multivalued degree. Therefore, a reliability of the reading Data D1 is improved.

Further, the read cache block (the block Bc) is reused without being subjected to data copying by the GC. In other words, in a case where data is written up to a final page of the read cache block, the controller 4 clears the second LUT, and erases the read cache block.

As described above, in this embodiment, the read cache block having a low multivalued degree is secured in the NAND flash memory 5 of the SSD 3 unlike the block having a high multivalued degree where data is stored. Then, the data is written to the read cache block when the data is read from the NAND flash memory 5 based on the read command from the host 2. With this configuration, the data is read from the read cache block in response to the later read commands.

Therefore, the host 2 can make a high speed and reliable access to a block of the SSD 3 having a low multivalued degree.

Further, in this embodiment, the read buffer 31 may be omitted. In other words, the controller 4 reads Data D1 without passing through the read buffer 31, and may transmit the data to the host 2 or write to the NAND flash memory 5.

Second Embodiment

This embodiment is a modification of the first embodiment. In the first embodiment, the data of the LBA designated by the read command is written to the read cache block. In addition, considering locality in reference, the peripheral data of the data is also accessed at the same time in many cases. The reason is because necessary data in a certain application program has a high possibility to be stored in a predetermined range of the LBA for example.

In this embodiment, the data of the LBA in the periphery of the data read by the read command is also written to the read cache block.

Further, a configuration of the computer system 1 according to this embodiment is similar to that of the first embodiment, and the description will be omitted.

Figure 5:
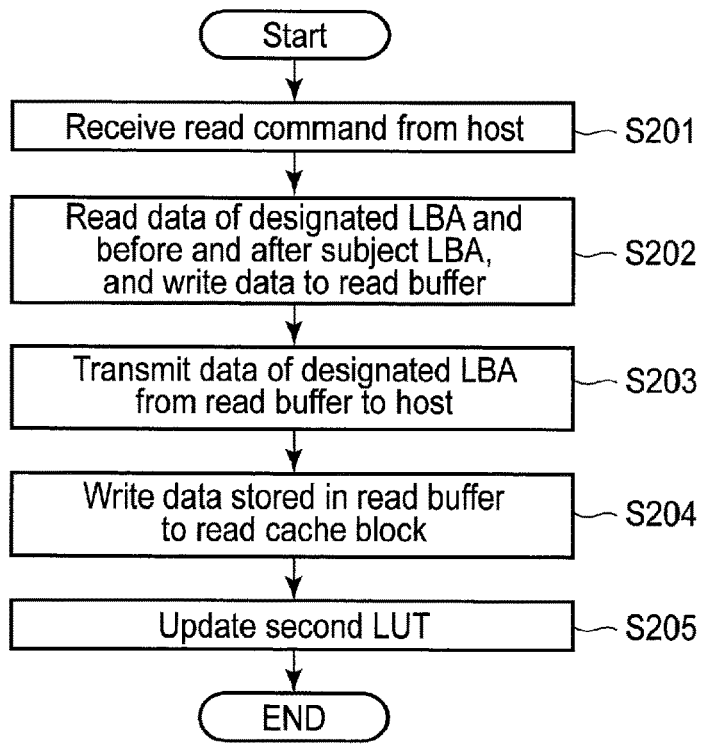
FIG. 5 is a flowchart illustrating an example of the data flow in the SSD in the computer system according to a second embodiment.

FIG. 5 is a flowchart illustrating an example of the data flow in the SSD 3 in the computer system 1 according to this embodiment.

In Step S201, the controller 4 of the SSD 3 receives the read command from the host 2.

In Step S202, the controller 4 reads, for example, Data D1 designated by the read command and the data of the LBA range in the periphery of the LBA of Data D1 range (logical address range) by the block Ba of the NAND flash memory 5. Herein, the peripheral LBA range is expressed by the LBA (x−k) to the LBA (x−1) and/or the LBA (y+1) to the LBA (y+k) when the LBA of Data D1 range is set to the LBA (x) to the LBA (y) and "k" is an integer. The reading data is written to the read buffer 31. Further, in a case where the data length of Data D1 is "1", "x" and "y" become equal.

In Step S203, the controller 4 reads Data D1 (that is, the data of the LBA designated by the read command) from the read buffer 31, and transmits Data D1 to the host.

In Step S204, the controller 4 writes the data stored in the read buffer 31 to the block Bc (read cache block) similarly to Step S104. Further, any one of the processes of Steps S203 and S204 may be performed earlier.

In Step S205, the controller 4 updates a place related to the data written in Step S204 in the second LUT similarly to Step S105.

As described above, in this embodiment, in a case where the read command with respect to a certain LBA is received from the host 2, the data of the subject LBA designated by the read command is read together with the data of the LBA in a range before and after (or peripheral) the subject LEA, and written to the read cache block. With this configuration, the access performance of the host 2 with respect to the SSD 3 is improved still more.

Further, similarly to the first embodiment, the read buffer 31 may be omitted even from this embodiment.

Third Embodiment

This embodiment is a modification of the first and second embodiments. In the first and second embodiments, the data read by the read command is left in the block of the reading source. In other words, the reading data exists in both the block of the reading source and the read cache block. On the other hand, in this embodiment, the data existing in the block of the reading source is erased. In other words, the reading data exists only in the read cache block.

Further, the configuration of the computer system 1 according to this embodiment is similar to those of the first and second embodiments, and the description will be omitted.

Figure 6:
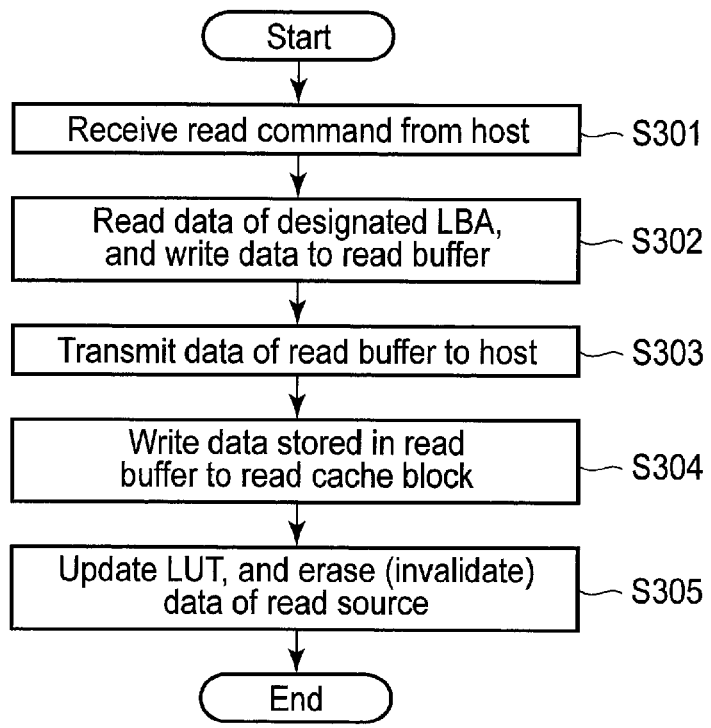
FIG. 6 is a flowchart illustrating an example of the data flow in the SSD in the computer system according to a third embodiment.

FIG. 6 is a flowchart illustrating an example of the data flow in the SSD 3 in the computer system 1 according to this embodiment.

The processes of Steps S301 to S304 are similar to those of Steps S101 to S104 of FIG. 2, and the description will be omitted.

In Step S305, the controller 4 erases the reading data, and updates the LUT 34 such that the LUT 34 shows the read cache block. More specifically, the controller 4 rewrites the physical address in the block Ba where Data D1 is stored in the LUT 34 into the physical address of the writing source of Data D1 in the block Bc (read cache block). In this way, the data of the reading source is invalidated by rewriting the LUT 34.

Further, in a case where data is written up to the final page of the read cache block and the read cache block is reused, data becomes a GC target when the LOT 34 designates the data stored in the read cache block. In this case, the data is written to the block having a high multivalued degree (for example, the blocks Ba or Bb).

As described above, in this embodiment, the reading data is invalidated in the reading source (that is, erased by the reading source), and handled as one existing in the read cache block of the writing source. In other words, the refresh operation is also performed with respect to the data when the data is read out.

In general, the refresh operation is uniformly performed for each predetermined period or at predetermined timing in many cases. However, in this embodiment, the refresh operation is performed with respect to the data even at timing when the data is read (that is, when an access frequency to the data becomes high). With this configuration, the SSD 3 can perform the refresh operation at a more appropriate timing, and the reliability of the data stored in the SSD 3 is improved.

Further, similarly to the first embodiment, the read buffer 31 may be omitted even from this embodiment.

In addition, the configuration of this embodiment may be combined with the second embodiment. In other words, the LUT 34 is rewritten with respect to all the data written in the read cache block in the second embodiment (read data, data having the LBA in the periphery of the read data), and the data of the reading source may be invalidated.

Fourth Embodiment

Figure 7:
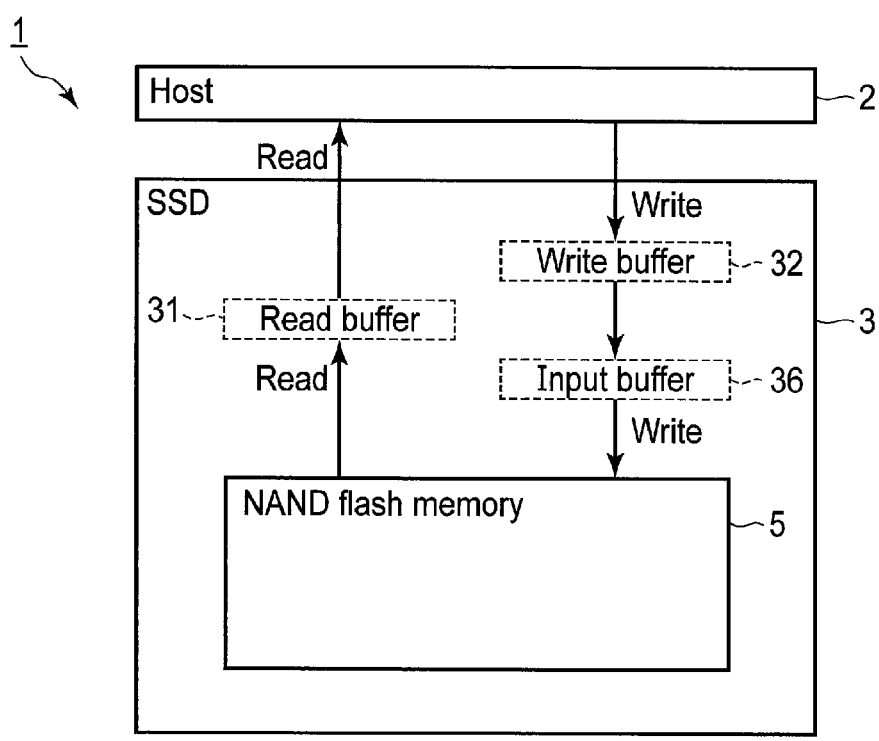
FIG. 7 is a diagram illustrating an example of a configuration of an SSD in the computer system according to a fourth embodiment.

FIG. 7 is a diagram illustrating a first example of the data flow in the SSD 3 in the computer system 1 according to this embodiment.

In this embodiment, the SSD 3 includes the input buffer 36 in addition to the read buffer 31, the write buffer 32, and the NAND flash memory 5. The input buffer 36 may include the NAND flash memory 5. As described above, in a case where the write command is received from the host 2, the input buffer 36 serves as a storage destination of the write data.

In addition, as described above, the multivalued degree of the NAND flash memory 5 is desirably larger than the multivalued degree of the input buffer 36. Hereinafter, it is assumed that the NAND flash memory 5 is configured using the QLC, and the input buffer 36 is configured using the SLC.

In this embodiment, similarly to the configurations of FIGS. 2 and 3, in a case where the read command is received from the host 2, the read data is written to the read buffer by the NAND flash memory 5, and the read data is transmitted from the read buffer to the host 2.

In addition, in a case where the write command is received from the host 2, the write data is written to the write buffer, written to the input buffer, and finally written to the NAND flash memory 5.

Further, this embodiment is configured to include the read buffer 31 and the write buffer 32, but the read buffer 31 and the write buffer 32 may be omitted.

Hereinafter, the data flow in the SSD 3 in the computer system 1 according to this embodiment will be described using FIGS. 8 and 9.

Further, FIG. 9 conceptually illustrates a data flow between the host 2 and the SSD 3 similarly to FIG. 2. In addition, Arrows A401 to A403 of FIG. 9 show the data flow.

The controller 4 of the SSD 3 is configured to manage the data stored in the NAND flash memory 5 using the LUT 34.

In Step S401, the controller 4 receives the read command which is issued from the host 2. The read command includes at least the LBA of the read data and a number of logical blocks (NLB) which is a read length.

In Step S402, the controller 4 determines any one of the read buffer 31, the write buffer 32, and the input buffer 36 which includes the data corresponding to the LBA included in the read command.

In a case where the subject data is included in any one of the read buffer 31, the write buffer 32, and the input buffer 36, the controller 4 transmits the subject data to the host in Step S405. On the other hand, in a case where the subject data is not included in any one of the read buffer 31, the write buffer 32, and the input buffer 36, the process proceeds to Step S403.

In Step S403, the controller 4 retrieves the LUT 34 using the LBA and the NLB of the data designated by the host 2, and acquires the physical address on the NAND flash memory 5 where the subject data is stored.

In Step S404, the controller 4 issues the read command with respect to the NAND flash memory 5 to read the data stored at the physical address, and reads the subject data.

Next, the controller 4 writes the read data to the read buffer 31 in Step S406 (Arrow A401), and transmits the read data to the host in Step S405 (Arrow A402). The processes of Steps S405 and S406 may be performed in parallel.

In Step S407, the controller 4 writes the read data to the input buffer 36 (Arrow A403). Further, the input buffer 36 is configured using the SLC as described above, and also is a storage destination of the write data from the host 2.

In Step S408, the controller 4 updates data indicating that the read data is stored in the input buffer 36. More specifically, as described in the third embodiment, in a case where the LBA of the data stored in the input buffer 36 using the LUT 34 and the physical address of the subject data are associated and managed, the LUT 34 is updated. In addition, similarly to the first and second embodiments, in a case where the LBA of the data stored in the input buffer 36 by the second LUT and the physical address of the data are associated and managed, the second LUT is updated.

Further, in a case where the reading process of the data from the NAND flash memory 5 fails in Step S406, the process ends. The case that the reading process fails is a case where an error correction of an error check and correction (ECC) fails for example.

FIG. 10 illustrates a data flow when the read data is read from the host 2 again after the read data is written to the input buffer 36 as described above.

In a case where the controller 4 receives the read command to read data from the host 2, the controller 4 determines whether the subject data is in the input buffer 36. In a case where the subject data exists, the subject data is read from the input buffer 36 and transmitted to the host 2 (Arrow A404). Further, in a case where the subject data is not in the input buffer 36, the subject data is read from the NAND flash memory 5.

In addition, in a case where the volume of data stored in the input buffer 36 exceeds a predetermined threshold for example, the controller 4 writes the data stored in the input buffer 36 to the NAND flash memory (Arrow A405).

As described above, this embodiment includes the input buffer 36 having a low multivalued degree in addition to the block having a high multivalued degree where the data is stored in the NAND flash memory 5. Then, when the data is read from the NAND flash memory 5 based on the read command from the host 2, the subject data is written to the input buffer 36. With this configuration, the subject data is read from the input buffer 36 with respect to the later read commands. Therefore, the host 2 can make a high speed and reliable access to a block having a low multivalued degree with respect to the SSD 3.

In addition, in this embodiment, only the input buffer 36 may be used instead of the read buffer 31. In other words, the process of Step S406 may be omitted. In a case where the input buffer 36 is configured by the NAND flash memory where the SLC is used for example, the read data is stored in all the input buffers 36 so that the capacity of the DRAM 6 used as the read buffers 31 can be zero. In general, since the NAND flash memory is less expensive than the DRAM, the capacity of the DRAM 6 can be omitted, and thus the cost of the SSD 3 can be reduced.

In addition, the data stored in the DRAM 6 is erased by shifting the SSD 3 to a low power mode or by turning on/off the power of the SSD 3 (that is, repeating a power cycle) for example. Therefore, a utilization effect of the input buffer 36 as a cache is increased by caching data in the input buffer 36.

Further, in the process of Step S407, the controller 4 may store the read data to the write buffer 32 instead of the input buffer 36. The write buffer 32 is configured by a volatile memory such as an SRAM and a DRAM as described above. The read data stored in the write buffer 32 is written to the input buffer 36 based on the control of the controller 4, finally written to the NAND flash memory 5 configured by the block having a high multivalued degree, and becomes nonvolatile data.

In this way, for example, in a case where the read data which is read from the NAND flash memory 5 is a read/modify/write target (that is, the data read in order to rewrite part of the read data), the number of rewriting the input buffer 36 can be reduced by writing the read data to the write buffer 32.

The description will be given more specifically. For example, the data of the read/modify/write target is immediately rewritten even being written to the input buffer 36. Therefore, the data after being rewritten is necessarily written to the input buffer 36. Therefore, the number of rewritable times of the input buffer 36 configured by the NAND flash memory is consumed. On the other hand, it is possible to prevent an unnecessary writing to the input buffer 36 by updating the data of the read/modify/write target in a volatile memory.

Further, the controller 4 may be configured to select whether to write the read data to the write buffer 32 or to write the read data to the input buffer 36 according to the command from the host 2. In this way, it is possible to reduce a load of rewriting of the input buffer 36 by selecting an appropriate writing source according to the read data.

Fifth Embodiment

This embodiment is a modification of the fourth embodiment. In the fourth embodiment, the read data which is read from the NAND flash memory 5 is written to the read buffer 31 in Step S406, and then also immediately written to the input buffer 36. On the other hand, in this embodiment, whether the subject read data is written to the input buffer 36 is determined based on a predetermined condition. Then, in a case where it is determined that the condition is satisfied, the subject read data is written to the input buffer 36.

Figure 11:
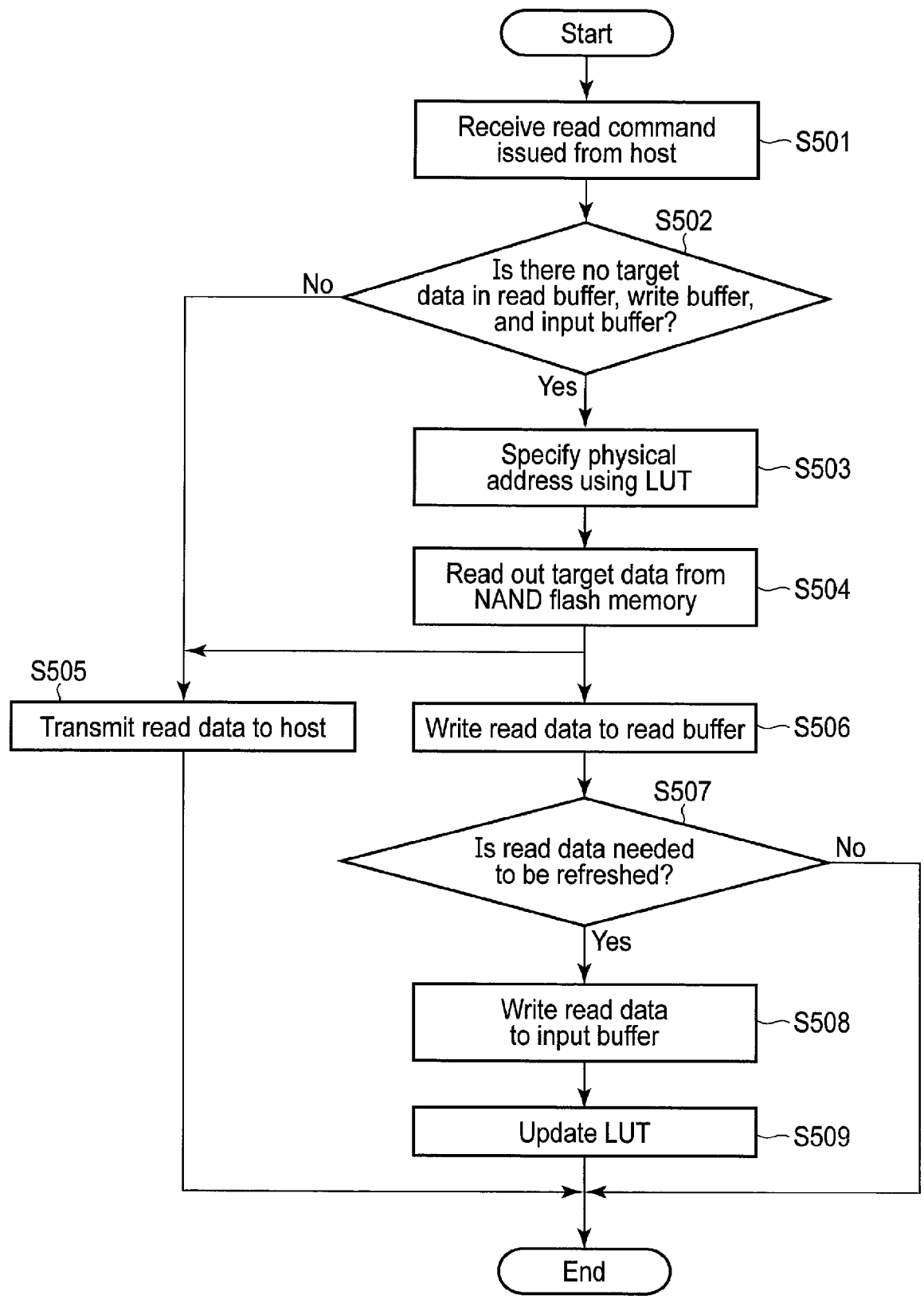
FIG. 11 is a flowchart illustrating an example of the data flow in the SSD in the computer system according to a fifth embodiment.

FIG. 11 is a flowchart illustrating an example of the data flow in the SSD 3 in the computer system 1 according to this embodiment.

The processes of Steps S501 to S506 are similar to those of Steps S401 to S406 of FIG. 8, and thus the description will be omitted.

In Step S507, the controller 4 determines whether the read data written to the input buffer 36 is needed to be refreshed. More specifically, the controller 4 may manage information indicating a period after the read data is written to the NAND flash memory 5 for example, and may determine, based on the information, whether the subject read data is needed to be refreshed.

In a case where it is determined that the subject read data is not needed to be refreshed, the process ends. On the other hand, in a case where it is determined that the subject read data is needed to be refreshed, the subject read data is written to the input buffer 36 in Step S508.

Further, the read data written to the input buffer 36 is finally written (that is, refreshed) to the NAND flash memory 5.

The processes of Steps S508 and S509 are similar to those of Steps S407 and S408 of FIG. 8, and thus the description will be omitted.

As described above, in this embodiment, the controller 4 determines whether the read data is needed to be refreshed. In a case where the refresh operation is necessary, the controller writes the subject read data to the input buffer 36. With this configuration, the SSD 3 can efficiently perform writing of the read data to the input buffer 36. In addition, since the number of times of writing the read data to the input buffer 36 is reduced, a life span of the input buffer 36 can be expanded.

Sixth Embodiment

This embodiment is a modification of the fifth embodiment. In this embodiment, whether the read data is written to the input buffer 36 is determined based on a condition different from that described above in Step S507 of the fifth embodiment.

FIG. 12 is a flowchart illustrating an example of the data flow in the SSD 3 in the computer system 1 according to this embodiment. Further, the processes of Steps S601 to S606 are similar to those of Steps S501 to S506 of FIG. 11, and thus the description will be omitted.

In Step S607, the controller 4 determines whether the read data is written to the input buffer 36.

In general, a writing amount of the SSD 3 is increased whenever the write command is received from the host 2. In the above respective embodiments, the read data is written to the input buffer 36 even in a case where the read command is received. Therefore, the writing amount to the SSD 3 is increased. In other words, the writing amount is increased whenever an access to the SSD 3 is performed.

Therefore, in Step S607, the controller 4 determines whether the writing amount exceeds a predetermined threshold. In a case where the writing amount is equal to or less than the predetermined threshold, the subject read data is written to the input buffer 36.

In addition, the controller 4 stores data indicating the writing amount in the SSD 3 in order to perform the process of Step S607. The data may be stored in, for example, the block management information 35. The data is desirably updated whenever the data is written to the NAND flash memory 5.

Further, the predetermined threshold is determined based on an index related to durability and a life span of the SSD 3 for example. More specifically, the predetermined threshold may be determined based on a the drive write per day (DWPD) of the SSD 3. Herein, the DWPD is an index indicating that how many units of capacity is rewritable per day, when a total storage capacity of the SSD 3 is defined as one unit, in order to use the SSD 3 at least over an guaranteed life span. Further, the predetermined threshold may be determined on other indexes such as a maximum rewriting capacity (TBW: Tera Byte Written) of the SSD 3 for example.

The processes of Steps S608 and S609 are similar to those of Steps S508 and S509 of FIG. 11, and thus the description will be omitted.

As described above, in this embodiment, the controller 4 sets the predetermined threshold based on the DWPD of the SSD 3, and compares the capacity with the predetermined threshold. In a case where there is a room for the writing amount in the SSD 3, the read data is written to the input buffer 36. With this configuration, it is possible to improve durability of the SSD 3 compared to a case where the read data is written in the input buffer 36 without condition as described in the embodiments.

Further, in this embodiment, the controller 4 may store data indicating a use property of the SSD for each user of the SSD 3 for example, and may store the data in the SSD. The data indicating the use property is, for example, statistical data related to the wiring amount to the SSD 3 at each time zone and the number of times of writing. The controller 4 uses the data indicating the use property in addition to the writing amount in Step S607, so that the determination process can be performed more flexibly.

For example, the data indicating the use property is updated according to a use situation of the SSD 3 at a certain time point. Then, at the next time point, a frequency of the process of writing the read data in the SSD 3 to the input buffer 36 may be corrected based on the data indicating the updated use property.

More specifically, for example, it is assumed that a large amount of read data is written to the input buffer 36 when the SSD 3 receives a large amount of read commands at a certain day. The controller 4 updates the data indicating the use property according to a use situation of the SSD 3 of that day. Then, the controller 4 may correct the frequency of the writing process such that the capacity of the read data to be written to the input buffer 36 is reduced on the next day by referring to the updated use property (that is, in order to suppress the writing process).

Seventh Embodiment

This embodiment is a modification of the fifth and sixth embodiments. In the fifth and sixth embodiments, the controller 4 of the SSD 3 determines whether the read data is written to the input buffer 36 based on a predetermined condition. On the other hand, in this embodiment, the host 2 transmits information to the SSD 3 which is necessary for determining whether the read data is written to the input buffer 36.

Figure 13:
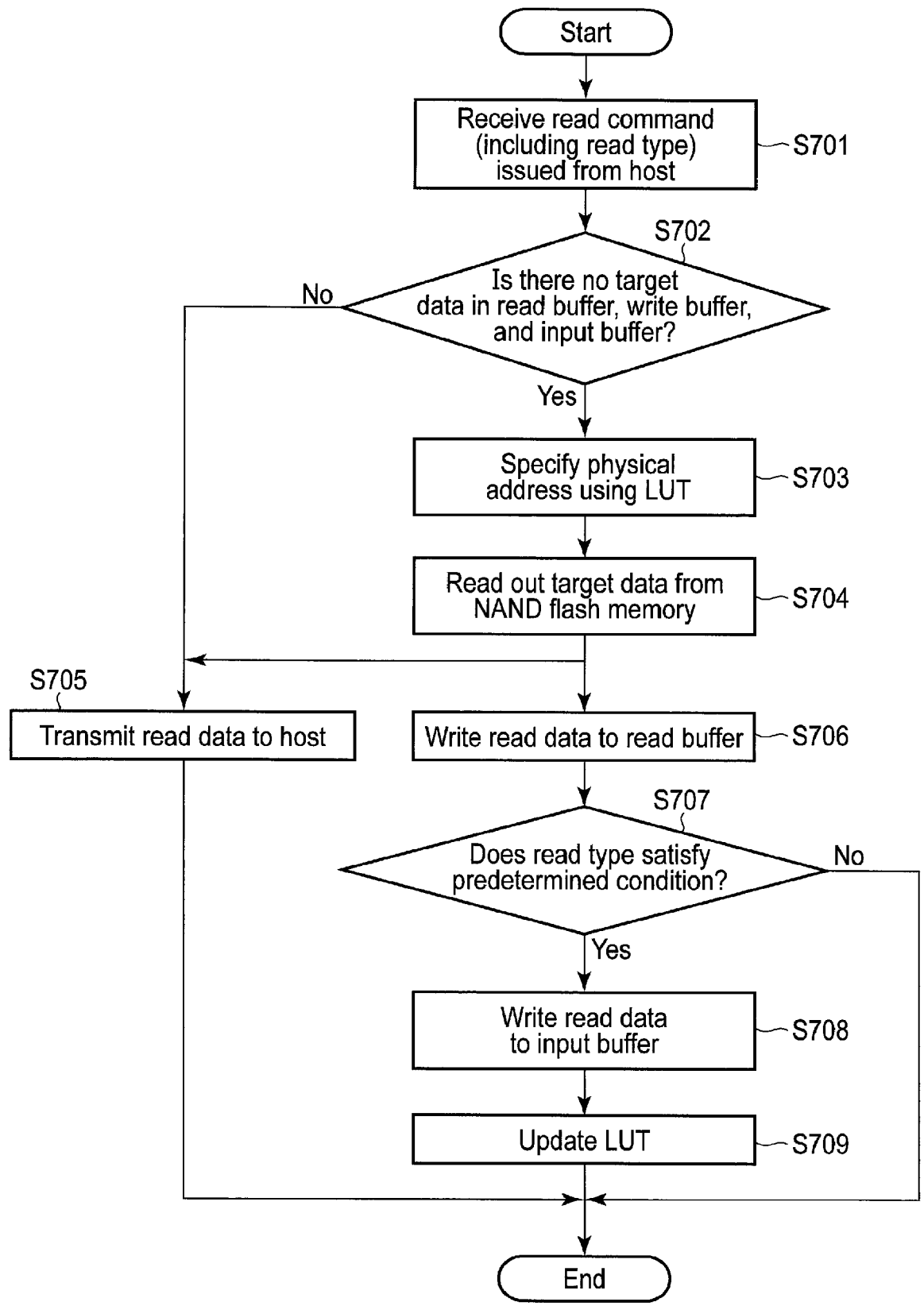
FIG. 13 is a flowchart illustrating an example of the data flow in the SSD in the computer system according to a seventh embodiment.

FIG. 13 is a flowchart illustrating an example of the data flow in the SSD 3 in the computer system 1 according to this embodiment.

In Step S701, the SSD 3 receives the read command which is issued from the host 2. The read command contains information (hereinafter, referred to as "read type") related to the type of the read command (or the reading process). The read type is information indicating a use of the read command or a property of the read data or the reading process for example, and generated by the host 2 which is a source of issuing the read command.

The read type includes, for example, a first type indicating that the read command is scheduled to be issued to read data necessary only one time, a second type indicating that the read command is scheduled to be issued to read/modify/write data, a third type indicating that the read command is scheduled to be issued to read data a plurality of times, a fourth type indicating that the read command is scheduled to be issued to read data which becomes hot data in the future, and a fifth type indicating that the read command is issued to read data which becomes cold data in the future.

Herein, the hot data is data which is accessed again during a short time period. In addition, the cold data is data which is not accessed for a while (long time period) after being accessed once.

As illustrated in FIG. 14, for example, the read type may be expressed using "context attribute" contained in data set/management/command in conformity with the non-volatile memory express (NVMe) standard, which is a connection standard of the SSD. FIG. 14 illustrates a context attribute of the data of the LBA range in the data set/management/command. The context attribute indicates various types of attributes related to the data of the designated LBA range, for example, 4-byte (32-bit) information.

For example, in addition to a start (head) LBA and a logical block length, the host 2 includes the context attribute of the LBA range designated by the start LBA and the logical block length in the data set/management/command.

In FIG. 14, for example, [10] bit is 1-bit information indicating whether the data is a writing target. The host 2 turns on [10] bit, for example, in a case where the read data is a read/modify/write target. In other words, the host 2 is configured to notify that the read data is the second type to the SSD 2 using [10] bit of the attribute information.

In addition, for example, [03:00] bit is 4-bit information indicating an access frequency. For example, a case where [03:00] bit is "0001b" indicates that the data is written and read at a normal (typical) access frequency. Similarly, for example, a case where [03:00] bit is "0101b" indicates that the data is written at a high frequency and read at a high frequency.

The host 2 sets [03:00] bit to "0100b" or "0101b" in a case where the read data is the hot data for example. With this configuration, the read type which is the fourth type is notified to the SSD 3. In addition, the host 2 sets [03:00] bit to "0010b" or "0011b" in a case where the read data is the cold data for example. With this configuration, the read type which is the fifth type is notified to the SSD 3.

The read type may be performed by another method. For example, the read type may be included in the read command. More specifically, the first to fifth types may be expressed using several bits of the data set/management/field which is contained in the read command. In addition, the read type may be notified to the SSD 3 by a command different from the read command.

Returning to FIG. 13, in Steps S702 to S706, the controller 4 reads the read data designated by the read command from the NAND flash memory 5, writes the read data to the read buffer, and transmits the read data to the host 2. Further, the processes of Steps S702 to S706 are similar to those of Steps S602 to S606.

In Step S707, the controller 4 determines whether the received read type satisfies a predetermined condition. In a case where the condition is satisfied, the read data is written to the input buffer 36. More specifically, the controller 4 controls the wiring of the read data to the input buffer 36 as the following (A) to (E) based on the read type.

In a case where the first information is received, that is, in a case where the reading of the subject read data is performed only once, the target data has a possibility to be not the hot data. Therefore, the controller 4 does not write the subject read data to the input buffer 36.

In a case where the second information is received, that is, in a case where the read/modify/write is performed using the subject read data, the subject read data has a high possibility to be old. Therefore, the controller 4 does not write the subject read data to the input buffer 36.

In a case where the third information is received, that is, in a case where the subject read data is read a plurality of times, the subject read data has a high possibility to be the hot data. Therefore, the controller 4 writes the subject read data to the input buffer 36. With this configuration, the subject read data actively reads the data from the input buffer 36 instead of the NAND flash memory 5.

In a case where the fourth information is received, that is, in a case where the read data is the hot data, the controller 4 writes the subject read data to the input buffer 36.

In a case where the fifth information is received, that is, in a case where the read data is the cold data, the controller 4 does not write the subject read data to the input buffer 36.

Further, the cold data is rarely referred repeatedly by the host 2, so that it is possible to avoid an unnecessary writing to the input buffer 36 by not performing the writing to the input buffer 36.

In addition, the write data which is designated by the write command from the host 2 and written to the input buffer 36 is the hot data. Herein, a block where the cold data and the hot data are mixed has a low GC efficiency in general. Therefore, in this embodiment, the cold data is not written to the input buffer 36, so that the GC efficiency of the input buffer 36 is prevented from being lowered.

The processes of Steps S708 and S709 are similar to those of Steps S608 and S609 of FIG. 12, and the description will be omitted.

As described above, in this embodiment, the host 2 notifies the read type to the SSD 3. Then, the SSD 3 determines whether the read data is written to the input buffer 36 based on the information. With this configuration, the SSD 3 can suppress an unnecessary writing to the input buffer 36.

In addition, in a case where the input buffer 36 is configured by the NAND flash memory using the SLC for example, the capacity of the DRAM 6 used as the read buffer 31 can be reduced by writing the data to the input buffer 36 according to the type of the read command. With this configuration, it is possible to reduce the cost of the SSD 3.

Eighth Embodiment

This embodiment is a modification of the seventh embodiment. Even in this embodiment, similarly to the seventh embodiment, the host 2 transmits information to the SSD 3 which is necessary for determining whether the read data is written to the input buffer 36.

Figure 15:
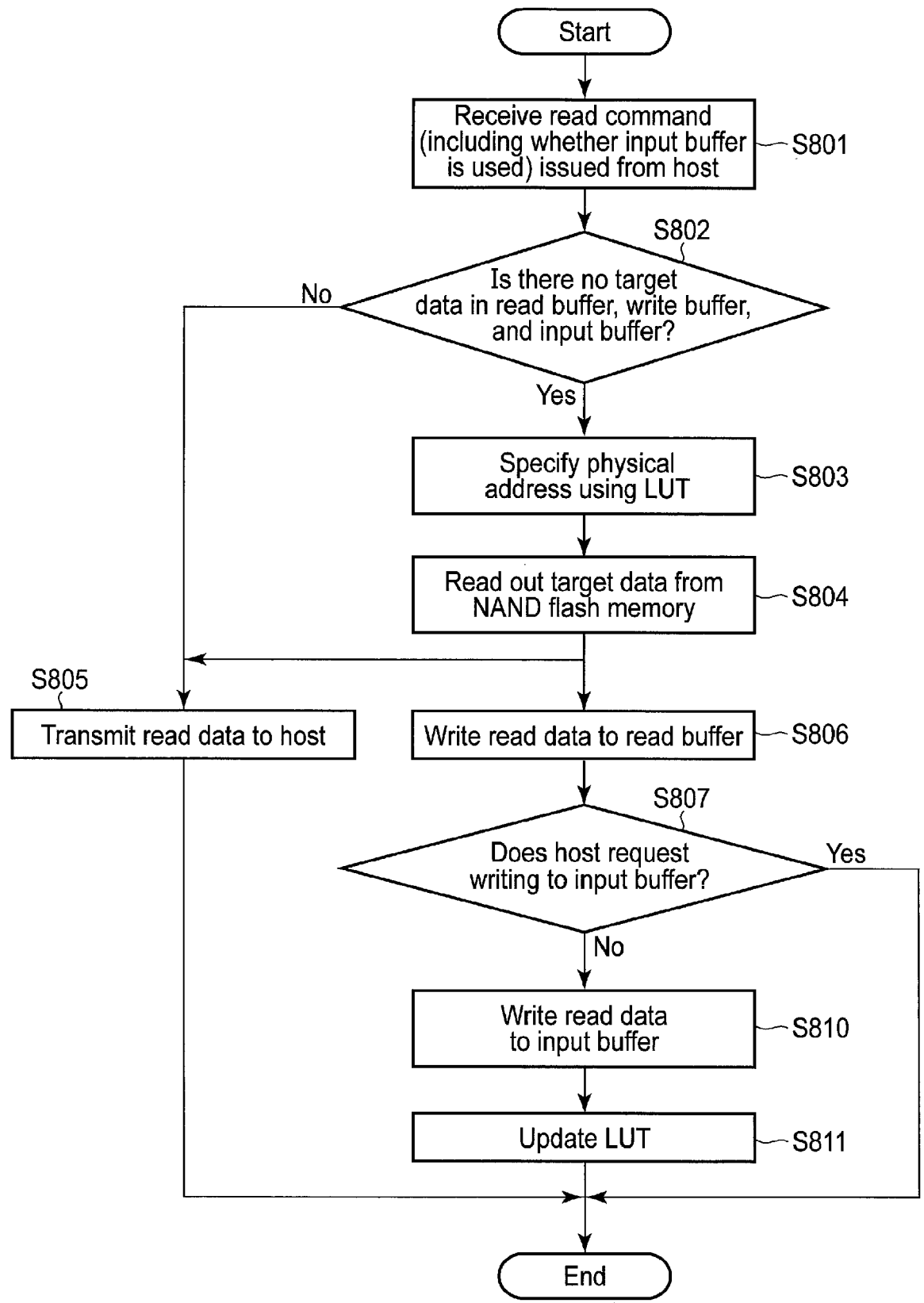
FIG. 15 is a flowchart illustrating an example of the data flow in the SSD in the computer system according to an eighth embodiment.

FIG. 15 is a flowchart illustrating an example of the data flow in the SSD 3 in the computer system 1 according to this embodiment.

In Step S801, the SSD 3 receives the read command which is issued from the host 2. The read command contains information indicating whether the input buffer 36 is used.

The information indicating whether the input buffer 36 is used is generated by the host 2 which is a source of issuing the read command. The information includes, for example, any one of information indicating that the input buffer 36 is used, information indicating that the input buffer 36 is not used, and information indicating that the SSD 3 determines whether the input buffer 36 is used.

The information indicating whether the input buffer 36 is used is desirably included in the read command. For example, the host 2 may indicate the information using several bits of a reserved region of the read command. In addition, for example, the host 2 may indicate the information by designating whether the subject read data is accessed at a fast speed.

In addition, the read type may be notified to the SSD 3 by a command different from the read command.

The processes of Steps S802 to S806 are similar to those of Steps S702 to S706, and the description will be omitted.

In Step S807, the controller 4 checks the information indicating whether the input buffer 36 is used, and determines whether the read data is written to the input buffer 36. Further, in a case where the SSD 3 determines whether the input buffer 36 is used based on the information, the controller 4 may determine whether the input buffer 36 is used, for example, based on the processes of the fourth to sixth embodiments.

The processes of Steps S808 and S809 are similar to those of Steps S708 and S709 of FIG. 13, and the description will be omitted.

As described above, according to this embodiment, the host 2 notifies the information to the SSD 3 which indicates whether the input buffer 36 is used. On the basis of the information, the SSD 3 determines whether the read data is written to the input buffer 36. In other words, the SSD 3 can take over the determination on whether the input buffer 36 is used to the host 2, so that a processing load of the SSD 3 can be lightened. In addition, since the host 2 performs the determination, it is possible to securely suppress an unnecessary writing to the input buffer 36.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device which is capable of connecting to a host through an interface, comprising:
   a nonvolatile memory which includes a plurality of blocks; and
   a controller which is electrically connected to the nonvolatile memory,
   wherein the controller is configured, when a read command is received from the host, to read first data designated by the read command from a first block of the nonvolatile memory, to read second data corresponding to a logical address range in a periphery of a logical address range of the first data from the nonvolatile memory, to transmit the first data to the host, and to write the first data and the second data to a second block of the nonvolatile memory which is different from the first block.

2. The memory device according to claim 1,
   wherein a multivalued degree of the first block is different from a multivalued degree of the second block.

3. The memory device according to claim 1,
   wherein a multivalued degree of the first block is higher than a multivalued degree of the second block.

4. The memory device according to claim 1, further comprising an address conversion table which manages mapping between a plurality of logical addresses and a plurality of physical addresses of the nonvolatile memory,
   wherein the controller is configured, when the first data is written to the second block, to map a physical address of a writing source of the first data to a logical address of the first data by updating the address conversion table.

5. The memory device according to claim 1,
   wherein, when the read command designating the first data is received from the host after the first data is written to the second block, the controller reads the first data from the second block of the nonvolatile memory and transmits the first data to the host.

6. The memory device according to claim 1, further comprising an address conversion table which manages mapping between a plurality of logical addresses and a plurality of physical addresses of the nonvolatile memory,
   wherein the address conversion table is loaded from the nonvolatile memory to a memory included in the memory device when the memory device is powered on.

7. The memory device according to claim 1, wherein the controller is electrically connected to the nonvolatile memory through a first interface.

8. A memory device which is capable of connecting to a host through an interface, comprising:
   a nonvolatile memory which includes a plurality of blocks;
   a controller which is electrically connected to the nonvolatile memory; and
   a buffer which includes a multivalued degree lower than a multivalued degree of the nonvolatile memory and, when data to be written from the host to the nonvolatile memory is received, stores the data,
   wherein the controller is configured to
   store a writing amount with respect to the nonvolatile memory; and
   when a read command is received from the host, read first data designated by the read command from a first block of the nonvolatile memory, transmit the first data to the host, write the first data to the buffer when the writing amount is equal to or less than a predetermined threshold, and not write the first data to the buffer when the writing amount is not equal to or less than the predetermined threshold.

9. The memory device according to claim 8, wherein the controller is configured to write the first data to the buffer when it is determined that the first data is needed to be refreshed, and not to write the first data to the buffer when it is determined that the first data is not needed to be refreshed.

10. The memory device according to claim 8, wherein the predetermined threshold is set based on a drive write per day (DWPD) which is an index indicating how many units of capacity are rewritable per day when a total storage capacity of the nonvolatile memory is one unit.

11. The memory device according to claim 8, wherein the controller is configured, when information which indicates a type of the read command or a type of a reading process corresponding the read command is received from the host, to determine whether the first data is written to the buffer based on the information.

12. The memory device according to claim 11, wherein the controller is configured to write the first data to the buffer when the information indicates that the reading process with respect to the first data is performed a plurality of times and the first data is not a read/modify/write target.

13. The memory device according to claim 8, wherein the controller is configured to write the first data to the buffer when information which indicates whether the buffer is used is received from the host and the information indicates that the buffer is used, and the controller is configured not to write the first data to the buffer when the information received from the host indicates that the buffer is not used.

14. The memory device according to claim 8, wherein, when a read command designating the first data is received from the host after the first data is written to the buffer, the controller reads the first data from the buffer and transmits the first data to the host.

15. The memory device according to claim 8, further comprising an address conversion table which manages mapping between a plurality of logical addresses and a plurality of physical addresses of the nonvolatile memory, wherein the address conversion table is loaded from the nonvolatile memory to a memory included in the memory device when the memory device is powered on.

16. A computer system, comprising:

a computer; and a memory device which is capable of connecting to the computer through an interface, wherein the memory device comprises a nonvolatile memory which includes a plurality of blocks, a controller which is electrically connected to the nonvolatile memory, and a buffer which stores data to be written from the computer to the nonvolatile memory, the computer transmits a read command to the memory device, the read command including first information to read first data and second information to determine whether the first data is written to the buffer, and the controller is configured to read the first data designated by the first information from a first block of the nonvolatile memory, to transmit the first data to the computer, and to determine whether the first data is written to the buffer based on the second information.

17. The computer system according to claim 16, wherein the second information is information indicating a type of the read command or a type of a reading process corresponding to the read command.

18. The computer system according to claim 16, wherein the second information is information indicating whether the buffer is used.

19. The computer system according to claim 16, wherein the buffer includes a multivalued degree lower than a multivalued degree of the nonvolatile memory.

20. The computer system according to claim 16, wherein the second information is information indicating a type of the read command or a type of a reading process corresponding to the read command, and the controller is configured to write the first data to the buffer when the second information indicates that the reading process with respect to the first data is performed a plurality of times and the first data is not a read/modify/write target.

* * * * *